United States Patent
Solomon et al.

(10) Patent No.: US 6,374,382 B1
(45) Date of Patent: Apr. 16, 2002

(54) SHORT BLOCK CODE FOR CONCATENATED CODING SYSTEM

(75) Inventors: Gustave Solomon, deceased, late of Los Angeles, CA (US), by Allen Blumenthal, Administrator; Andrew L. Strodtbeck, Marina del Rey; Jennifer L. Vollbrecht, Torrance, both of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/211,445

(22) Filed: Dec. 15, 1998

(51) Int. Cl.[7] .............................................. H03M 13/00
(52) U.S. Cl. ...................................... 714/755; 714/790
(58) Field of Search ................................ 714/755, 761, 714/784, 774, 786, 746, 762, 794, 795, 792, 757, 790, 701, 787, 777; 455/13.3, 12.1, 430, 13.4, 69, 9; 370/307, 319, 320, 207, 318, 515, 309; 375/229, 234, 261, 257, 148, 262, 264, 265; 341/59; 382/245

(56) References Cited

U.S. PATENT DOCUMENTS

| | | | | |
|---|---|---|---|---|
| 4,907,233 A | * | 3/1990 | Deutsch et al. | 714/755 |
| 5,465,267 A | | 11/1995 | Todoroki | 375/279 |
| 5,734,962 A | * | 3/1998 | Hladik et al. | 455/12.1 |
| 6,023,783 A | * | 2/2000 | Divsalar et al. | 714/792 |
| 6,029,264 A | * | 2/2000 | Kobayashi et al. | 714/755 |
| 6,175,940 B1 | * | 1/2001 | Saunders | 714/746 |
| 6,182,260 B1 | * | 1/2001 | Kang et al. | 714/755 |

OTHER PUBLICATIONS

Berman, T et al. (An analytical analysis of a concatenated Reed–Solomon (RS)/Viterbi coding system both with and without RS interleaving; IEEE, 1992).*
Cygan, D et al. (A concatenated two–stage adaptive (CTSA) error control scheme for data transmission in time–varying channels; IEEE, Apr. 1995).*
Berman, T. et al. (An importance sampling analysis of a non–interleaved Viterbi decoder in an RFI environment; IEEE, 1992).*
Tsie, K.Y. et al. (Concatenated trellis–coded 8–ary PSK for land mobile satellite communications; IEEE, 1992).*
Agnelli, S. et al. (Transmission of framed ATM cell streams over satellite: a field experiment; IEEE, 1995).*
Papke, L. et al. (Different iterative decoding algorithms for combined concatenated coding and multiresolution modulation; IEEE, 1994).*

* cited by examiner

Primary Examiner—Albert Decady
Assistant Examiner—Guy Lamarre
(74) Attorney, Agent, or Firm—Terje Gudmestad

(57) ABSTRACT

A soft decision decodable short binary block coding arrangement is provided for use as an inner code with a Reed-Solomon outer code in a concatenated coding scheme. The inner code is a (n,k) short block code having a message length k×i, where i is a small integer selected to eliminate any need for interleaving between the inner and outer codes. Eliminating interleaving mitigates inner code decoder burst errors. The inner code is preferably formed as a punctured (15,11) Hamming code modified to form a (12,8) code sequence.

19 Claims, 4 Drawing Sheets

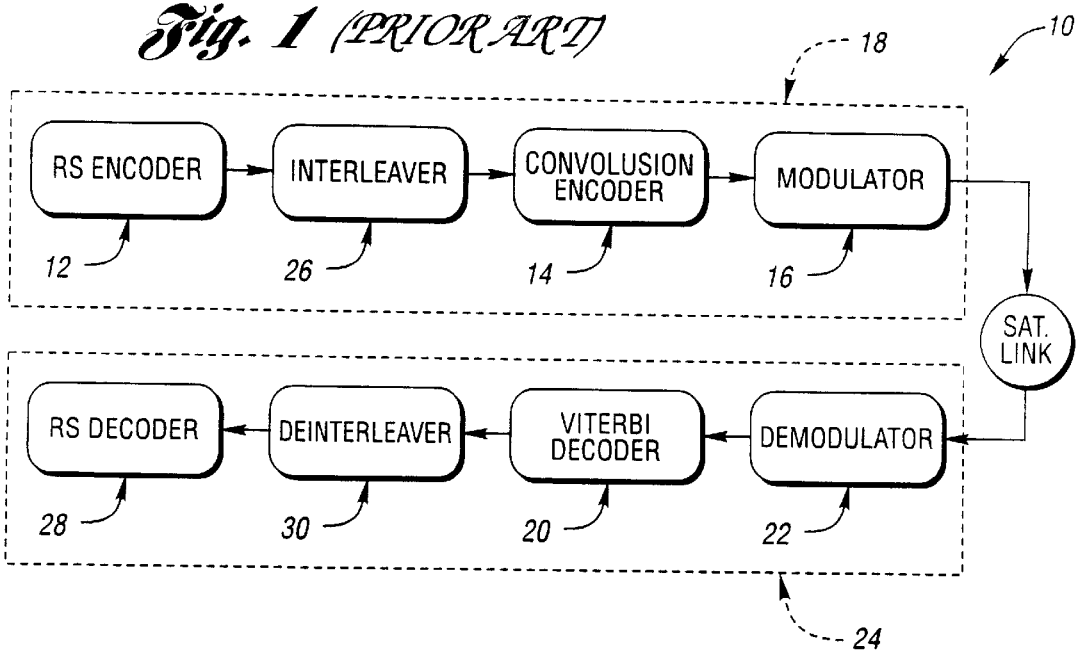
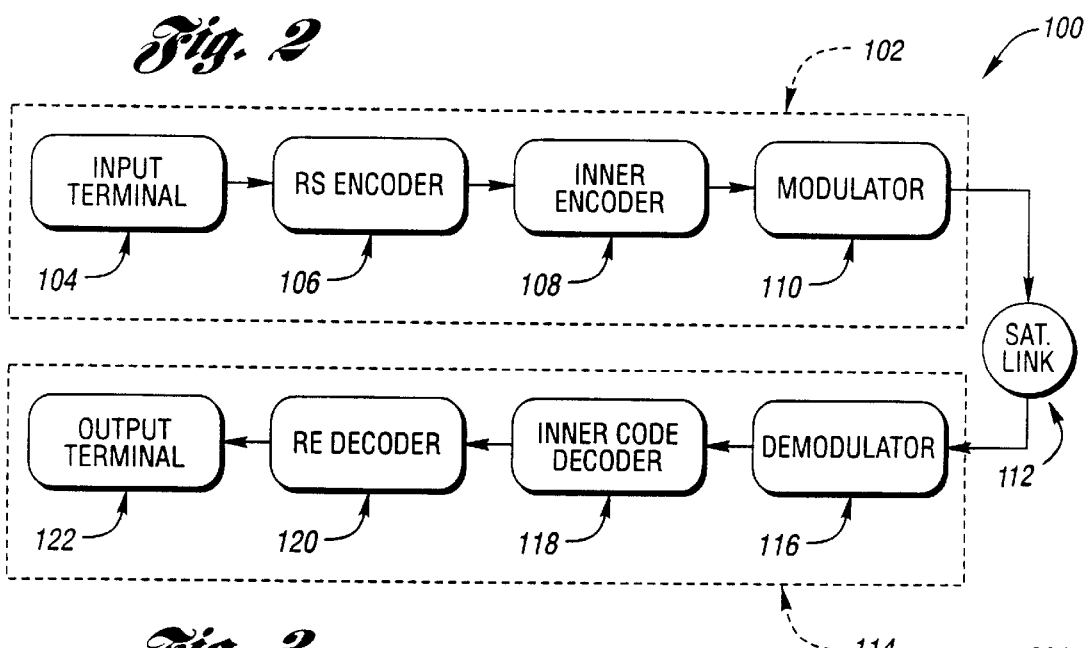
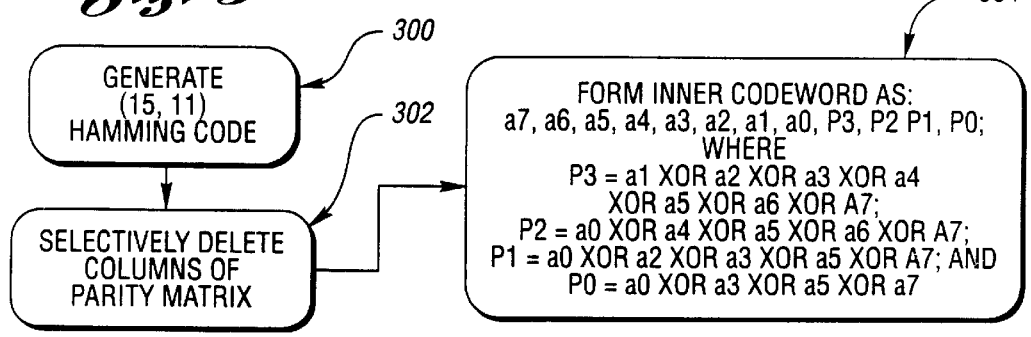

if (|a| > |b|)
c = a
state = 1
else
c = b
state = 0

US 6,374,382 B1

SHORT BLOCK CODE FOR CONCATENATED CODING SYSTEM

TECHNICAL FIELD

The present invention relates to a concatenated encoding arrangement suitable for space communications, and more particularly, to an inner code useful with a Reed-Solomon outer code in a concatenated encoding arrangement.

BACKGROUND ART

Referring to FIG. 1, known encoding arrangements 10 for use with satellite communication systems typically employed a concatenated coding scheme having a convolutional inner code sequence, and a Reed-Solomon (RS) outer code sequence as a way of providing high rate communication links at low signal power levels. Such systems include an RS encoder 12, a convolutional encoder 14, and modulator 16 at a transmitter 18. The convolutional code requires a Viterbi decoder 20 coupled to a demodulator 22 at the receiver end 24.

In addition, such a coding arrangement also requires an interleaver 26 between the convolutional and RS encoders to minimize the impact of burst errors. More specifically, in a concatenated coding system, an outer RS decoder 28 is undisturbed by errors which occur within a given eight bit symbol, i.e., about one constraint length of the convolutional inner code. However, performance of the RS decoder is degraded by longer burst errors, e.g., errors occurring among successive symbols, as can occur in the operation of the Viterbi decoder. As a consequence, interleaving the RS outer code is required for preventing or minimizing correlated errors, among successive symbols in the Viterbi inner decoder. Interleaving is defined as dispersing the original sequence of symbols in an RS codeword or frame in a block of frames by reordering the sequence so that consecutive bits of data are separated by a predetermined distance. A deinterleaver 30 is connected between the Viterbi decoder and the RS decoder.

While the use of an interleaver improves performance of a concatenated coding scheme using an RS outer code and a convolutional inner code, interleaving causes undesirably large processing delays for systems which use small packets either due to large minimum uplink burst size, or complex link protocols to pump or flush the interleaved data. In addition, such an arrangement requires prohibitively large on-board memory in systems where switching control necessitates on-board decoding.

DISCLOSURE OF THE INVENTION

It is therefore an object of the present invention to provide a coding scheme and communication system which utilizes concatenated coding without the need for interleaving the code sequence.

It is another object of the present invention to provide an inner coding scheme for use with an RS outer code in a concatenated coding system which does not require interleaving and is soft decision decodable.

In accordance with these and other objects, the present invention provides a system for transmitting concatenated encoded data signals having an inner code sequence and an outer code sequence, wherein the system includes a means for receiving a source signal having eight bit data symbols, a Reed-Solomon encoder for generating the outer code sequence based on the source signal, and an encoder for generating the inner code sequence as a the inner code sequence as a (n,k) short binary block code based on the source signal, wherein the short block encoder is arranged to generate the short block code with a message length k=8×i, with i being an integer small enough to obviate interleaving between the inner and outer codes. A transmitter processes and sends the inner and outer code sequences as the concatenated signal.

In accordance with a first embodiment of the present invention, the inner code comprises a (12,8;3) inner code formed from a punctured (15,11) Hamming code sequence. More specifically, three columns of a parity check matrix are selectively deleted to form the (12,8;3) inner code. The eight bit source signal would comprise a sequence of $a_0$, $a_2$, $a_3$, $a_4$, $a_5$, $a_6$, and $a_7$, and the inner code would be formed from the sequence of $a_7$, $a_6$, $a_5$, $a_4$, $a_3$, $a_2$, $a_1$, $a_0$, $P_3$, $P_2$, $P_1$, and $P_0$, where:

$P_3 = a_1$ XOR $a_2$ XOR $a_3$ XOR $a_4$ XOR $a_5$ XOR $a_6$ XOR $a_7$;

$P_2 = a_0$ XOR $a_4$ XOR $a_5$ XOR $a_6$ XOR $a_7$;

$P_1 = a_0$ XOR $a_2$ XOR $a_3$ XOR $a_6$ XOR $a_7$; and $P_0 = a_0$ XOR $a_1$ XOR $a_3$ XOR $a_5$ XOR $a_7$.

In accordance with a second embodiment, the inner code comprises a (12,8;3) inner code formed from two short block sequences. More specifically, a first block code sequence is formed from a subset of the eight data bits of the source signal to be transmitted and a parity bit based on the subset of data bits. A second block code sequence is formed from the remaining data bits of the source signal and three parity bits based on the remaining data bits. The short binary block code is formed as a sequence of both the first block code sequence and the first block code sequence combined with the second block code sequence. With both embodiments, the short block inner code is soft decision decodable at the receiving end.

In accordance with another aspect of the present invention, a method is provided for transmitting concatenated encoded data signals having an inner code sequence and an outer code sequence, wherein the method comprises receiving a source signal having eight bit data symbols, generating a Reed-Solomon encoded outer code sequence based on the source signal, and generating an inner code sequence as a (n,k) short binary block code based on the source signal, wherein the short block inner code is generated with a message length k=8×i, where i is an integer small enough to obviate interleaving between the inner and outer codes. The inner and outer code sequences are then processed and transmitted as a concatenated signal.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1 is a block diagram of a communication system in accordance with the prior art;

FIG. 2 is a block diagram of a communication system in accordance with the present invention;

FIG. 3 is a flow chart illustrating formation of the short block inner codeword in accordance with a preferred embodiment;

BEST MODE FOR CARRYING OUT THE INVENTION

Figure 4A:
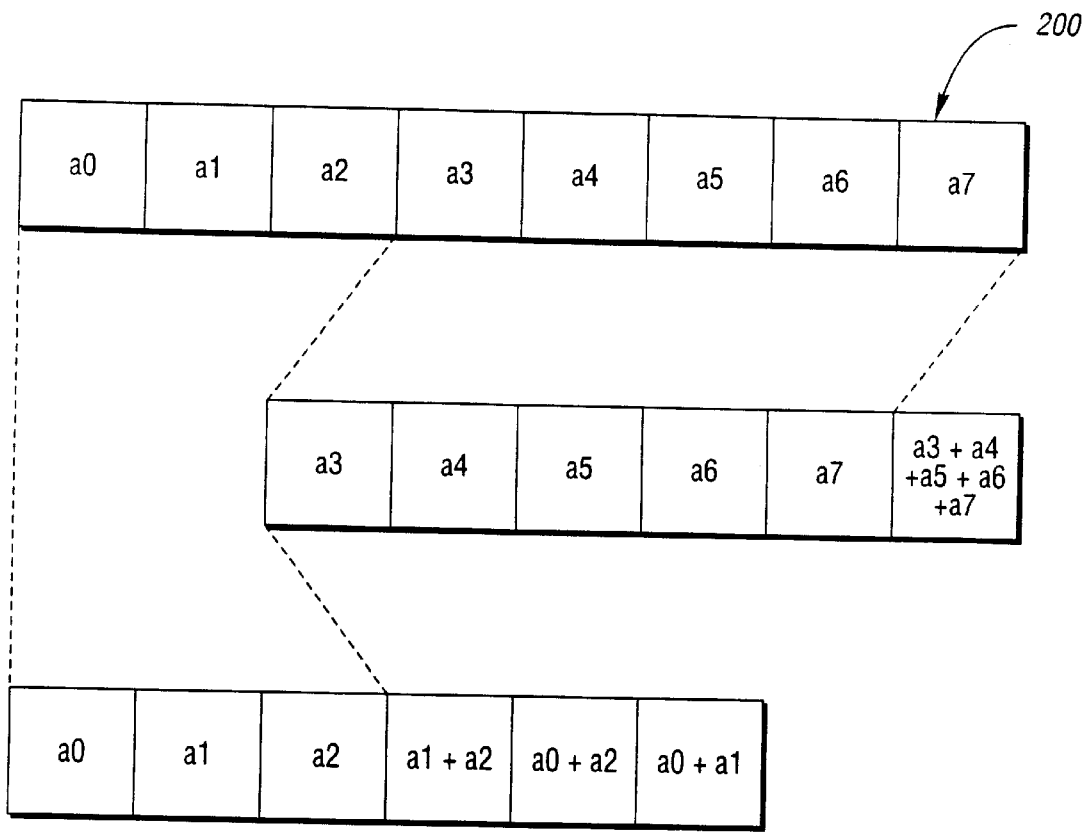
FIGS. 4a and 4b show a short block inner codeword in accordance with a second embodiment of the present invention.

A communication system 100 in accordance with the present invention is shown in FIG. 2 having a transmitter 102 including an input terminal 104 for receiving a data/voice signal to be transmitted, an RS encoder 106 for encoding the input signal to generate an RS outer code, and an inner encoder 108 for encoding the input signal to generate a short block inner code, as described more fully below. Transmitter 102 is arranged to form the inner and outer code as a concatenated signal which is transmitted via a modulator 110 to a satellite receiver link 112.

A receiver 114 includes a demodulator 116 for receiving the transmitted signal, an inner code decoder 118 for decoding the received inner code as described more fully below, and an RS decoder 120 for decoding the RS outer code. The decoded signal is then supplied to output terminal 122.

In accordance with the present invention, encoder 108 is arranged to generate the inner code as a (n,k) short block code having a message length k×i, where i is a small integer, such as 1, 2, or 3, selected to eliminate or obviate any need for interleaving between the inner and outer codes without degrading performance. The short block inner code of the present invention preferably provides 12 codeword bits for every 8 bit information signal, i.e., a rate of 2/3 to generate a inner code of (12,8). The inner code is formulated so as to maximize the coding distance while minimizing the number of codewords which exist at the minimum coding distance.

As shown in the flowchart of FIG. 3, the preferred embodiment for formulating the short block inner code involves producing a modified or punctured Hamming code. More specifically, Hamming codes are single-error correcting BCH codes with the following parameters:

code length $n=2^m-1$;

no. of information bits $k=2^m-m-1$;

no. of parity bits $n-k=m$.

As denoted at block 300, the process begins with m=4 to produce a (15,11) Hamming code. As described below, a (12,8) inner code is formed at block 302 by selectively deleting certain columns of the corresponding parity check matrix H.

The parity check matrix H is expressed as:

$$H=[P^T; I_{n-k}].$$

Thus, for a (15,11) code, $$H = \begin{bmatrix} 1 & 1 & 1 & 1 & 0 & 1 & 0 & 1 & 1 & 0 & 0 & 1 & 0 & 0 & 0 \\ 0 & 1 & 1 & 1 & 1 & 0 & 1 & 0 & 1 & 1 & 0 & 0 & 1 & 0 & 0 \\ 0 & 0 & 1 & 1 & 1 & 1 & 0 & 1 & 0 & 1 & 1 & 0 & 0 & 1 & 0 \\ 1 & 1 & 1 & 0 & 1 & 0 & 1 & 1 & 0 & 0 & 1 & 0 & 0 & 0 & 1 \end{bmatrix}.$$

To form the (12,8) inner code, the columns $$\begin{bmatrix} 0 & 0 & 0 \\ 1 & 1 & 0 \\ 1 & 0 & 1 \\ 0 & 1 & 1 \end{bmatrix}$$

are deleted to produce:

$$H = \begin{bmatrix} 1 & 1 & 1 & 1 & 0 & 1 & 1 & 1 & 1 & 0 & 0 & 0 \\ 0 & 1 & 1 & 1 & 1 & 0 & 0 & 1 & 0 & 1 & 0 & 0 \\ 0 & 0 & 1 & 1 & 1 & 1 & 1 & 0 & 0 & 0 & 1 & 0 \\ 1 & 1 & 1 & 0 & 1 & 0 & 1 & 0 & 0 & 0 & 0 & 1 \end{bmatrix}.$$

where columns 1–8 correspond to $P^T$ which can be rearranged without affecting the distance property of the code, and columns 9–12 correspond to $I_{n-k}$.

As denoted at block 304, formulation of the inner codeword is then expressed as the sequence $a_7$, $a_6$, $a_5$, $a_4$, $a_3$, $a_2$, $a_0$, $P_3$, $P_2$, $P_1$, $P_0$, where:

$P_3=a_1$ XOR $a_2$ XOR $a_3$ XOR $a_4$ XOR $a_5$ XOR $a_6$ XOR $a_7$;

$P_2=a_0$ XOR $a_4$ XOR $a_5$ XOR $a_6$ XOR $a_7$;

$P_1=a_0$ XOR $a_2$ XOR $a_3$ XOR $a_6$ XOR $a_7$; and $P_0=a_0$ XOR $a_1$ XOR $a_3$ XOR $a_5$ XOR $a_7$.

A second embodiment for non-systematic formulation of the inner code will now be described in context with FIGS. 4a and 4b. More specifically, an eight bit sequence, $a_0$, $a_1$, $a_2$, ... $a_7$ of an information signal 200 to be coded is processed into two short blocks A and B of six bits length each. Block A is formed based on a subset of the eight bit information signal 200, and in the example shown in FIG. 4a, the subset begins with bit $a_3$. A (6,5;2) parity code is used so that block A results in a six bit sequence as follows: $a_3$, $a_4$, $a_5$, $a_6$, $a_7$, and a parity bit=$a_3+a_4+a_5+a_6+a_7$. Block B is then formed based on the remaining bits of the eight bit information signal 200 using a (6,3;3) code scheme to generate a six bit sequence as follows: $a_0$, $a_1$, $a_2$, $a_1+a_2$, $a_0+a_2$, and $a_0+a_1$.

Figure 4B:
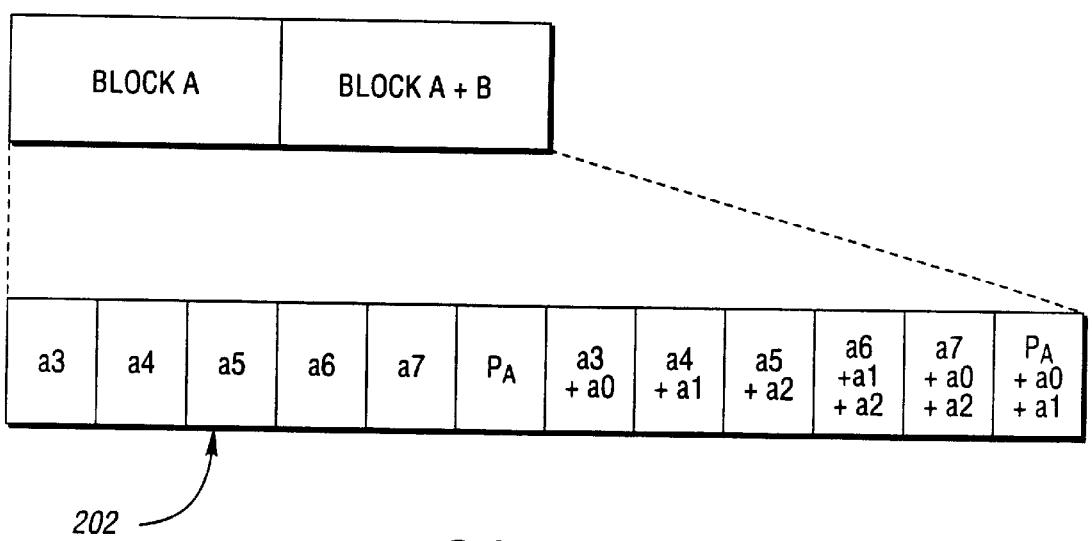

As shown in FIG. 4b, after short blocks A and B are formed, an inner code sequence 202 corresponding to the original eight bits of information signal 200 is formed as a sequence of block A and block A+block B. This results in the following bit sequence: $a_3$, $a_4$, $a_5$, $a_6$, $a_7$, $(a_3+a_4+a_5+a_6+a_7)$, $a_3+a_0$, $a_4+a_1$, $a_5+a_2$, $a_6+(a_1+a_2)$, $a_7+(a_0+a_2)$, and $(a_3+a_4+a_5+a_6+a_7)+(a_0+a_1)$. Therefore, inner code 202 produces 12 codeword bits for every eight bits of information with a code distance equal to 3.

Figure 5:
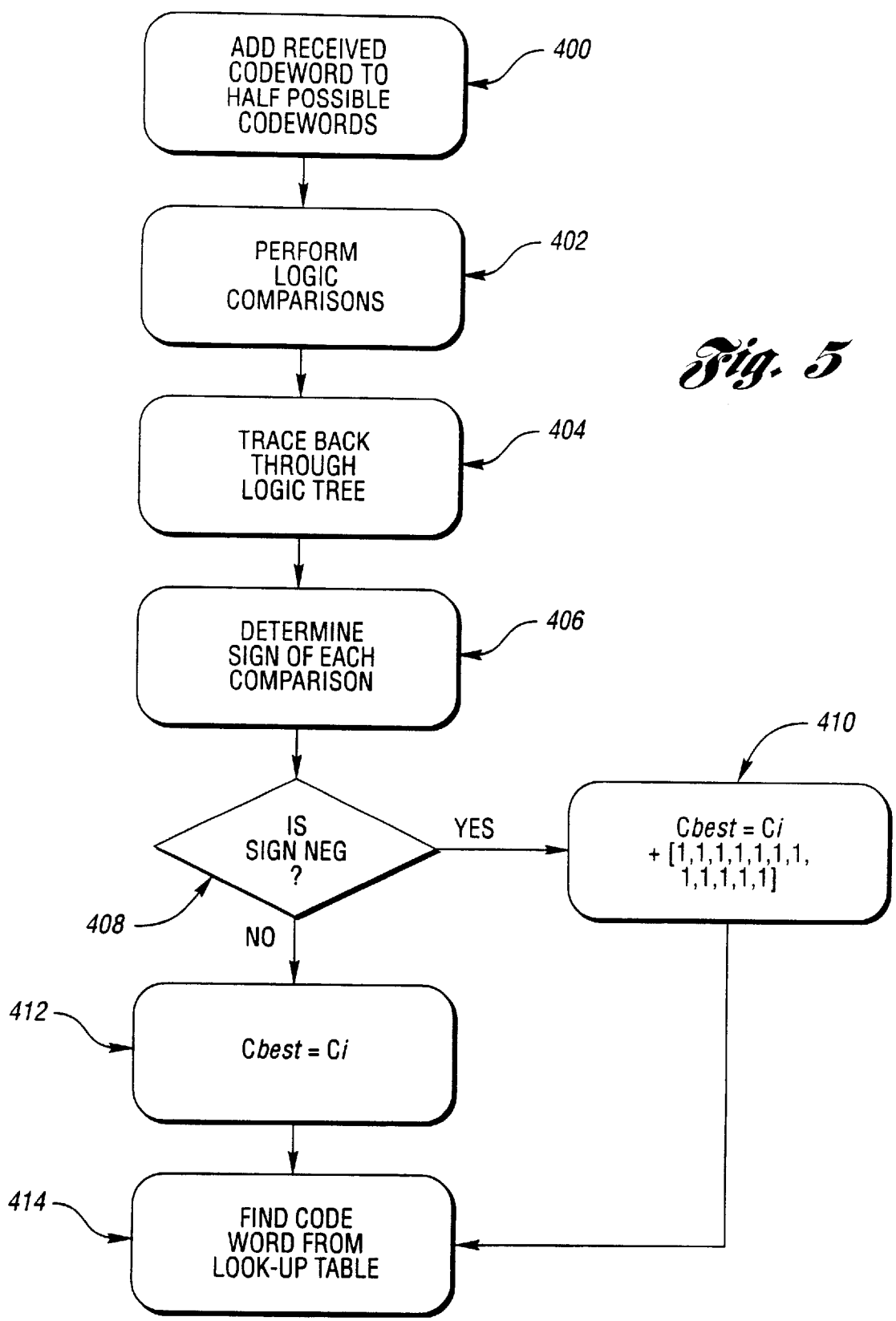
FIG. 5 is a flow chart illustrating the soft decision decoding process of the present invention.
Figure 6A:
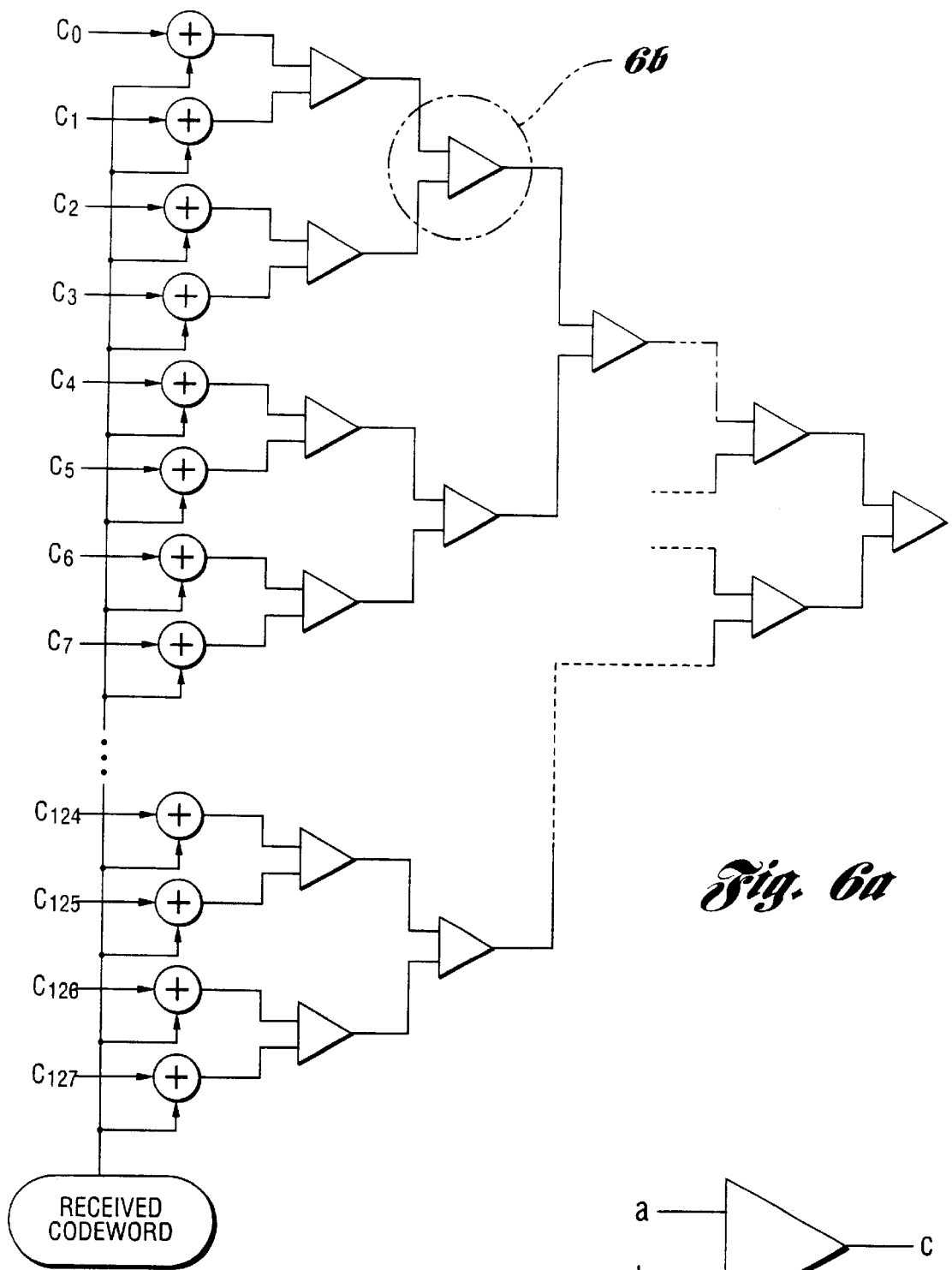
FIGS. 6a and 6b show a logic diagram for a soft decision decoding arrangement in accordance with the present invention.
Figure 6B:
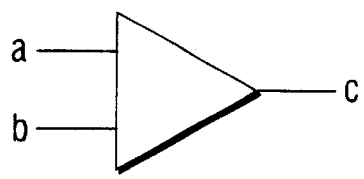

Referring now to FIGS. 5, 6a, and 6b, a flow chart and logic diagram illustrate the soft decision decoding of the (12,8) inner code in accordance with the present invention. More specifically, at block 400, the received codeword is added to one-half the potential codewords, thereby forming 128 parallel additions. The set of codewords $C_1=\{C_0, \ldots C_{127}\}$ are selected such that $C_1+[1,1,1,1,1,1,1,1,1,1,1,1]$=the entire set of codewords. As denoted at block 402, 127 comparisons are then made in accordance with the logic diagram of FIG. 6b, i.e., if $|a|>|b|$, then c=a and state=1; otherwise c=b and state=0, where a and b are inputs to a comparator and c is the output or result of the comparator.

At block 404, the process traces back through the tree to find the best guess $C_i$, where $0 \leq i \leq 127$. As shown at block 406, the sign of a particular comparator result is examined, and at block 408, if the sign is a negative ("−"), at block 410, $C_{best}=C_i+[1,1,1,1,1,1,1,1,1,1,1,]$. Otherwise, at block 412, $C_{best}=C_i$. Then, at block 414, a look-up table is addressed to determine the message corresponding to $C_i$.

While the best mode for carrying out the invention has been described in detail, those familiar with the art to which this invention relates will recognize various alternative designs and embodiments for practicing the invention as defined by the following claims.

What is claimed is:

1. A system for transmitting concatenated encoded data signals having an inner code sequence and an outer code sequence, said system comprising:

means for receiving a source signal having eight bit data symbols;

a Reed-Solomon encoder for generating the outer code sequence based on the source signal;

an encoder for generating the inner code sequence as a (n,k) short binary block code based on the source signal, wherein said encoder is arranged to generate the short block code with a predetermined message length k=8×i, with i being an integer small enough to obviate interleaving between the inner and outer codes; and a transmitter for transmitting the inner and outer code sequences as a concatenated signal.

2. The system of claim 1 wherein said (n,k) short binary block code comprises a (12,8;3) short binary block code.

3. The system of claim 2 wherein said (12,8;3) short binary block code comprises:

a first block code sequence formed from a subset of the eight data bits of the source signal to be transmitted, and a parity bit based on the subset of data bits; and a second block code sequence formed from the remaining data bits of the eight bits of the source signal, and three parity bits based on the remaining data bits, wherein said short binary block code is formed as a sequence of both said first block code sequence, and said first block code sequence combined with said second block code sequence.

4. The system of claim 3 wherein the eight bit source signal comprises a sequence of $a_0$, $a_1$, $a_2$, $a_3$, $a_4$, $a_5$, $a_6$, and $a_7$, and said first block code sequence is formed as $a_3$, $a_4$, $a_5$, $a_6$, $a_7$, $a_3+a_4+a_5+a_6+a_7$.

5. The system of claim 4 wherein said second block code sequence is formed as $a_0$, $a_1$, $a_2$, $a_1+a_2$, $a_0+a_2$, $a_0+a_1$.

6. The system of claim 1 further comprising a receiver for receiving the transmitted concatenated signal, said receiver comprising a Reed-Solomon decoder for decoding the outer code sequence, and a soft decision decoder for decoding the inner code sequence.

7. The system of claim 6 wherein said soft decision decoder comprises a signal processor operative to add a received inner codeword to each of a plurality of codewords selected from a set of all possible codewords, compare the results of each addition, and identify which possible codeword best corresponds to the received inner codeword.

8. The system of claim 1 wherein said (n,k) inner code comprises a punctured Hamming code.

9. The system of claim 8 wherein said punctured Hamming code comprises a (15,11) Hamming code having three columns of a parity check matrix selectively deleted to form a (12,8;3) inner code.

10. The system of claim 9 wherein the eight bit source signal comprises a sequence of $a_0$, $a_1$, $a_2$, $a_3$, $a_4$, $a_5$, $a_6$, and $a_7$, and said inner code comprises the sequence of $a_7$, $a_6$, $a_5$, $a_4$, $a_3$, $a_2$, $a_1$, $a_0$, $P_3$, $P_2$, $P_1$, and $P_0$, where:

$P_3 = a_1$ XOR $a_2$ XOR $a_3$ XOR $a_4$ XOR $a_5$ XOR $a_6$ XOR $a_7$;

$P_2 = a_0$ XOR $a_4$ XOR $a_5$ XOR $a_6$ XOR $a_7$;

$P_1 = a_0$ XOR $a_2$ XOR $a_3$ XOR $a_6$ XOR $a_7$; and $P_0 = a_0$ XOR $a_1$ XOR $a_3$ XOR $a_5$ XOR $a_7$.

11. A method for transmitting concatenated encoded data signals having an inner code sequence and an outer code sequence, said method comprising:

receiving a source signal having eight bit data symbols;

generating a Reed-Solomon encoded outer code based on the source signal;

generating an inner code sequence as a (n,k) short binary block code based on the source signal, said short block inner code being generated with a predetermined message length k=8×i, where i is an integer small enough to obviate interleaving between the inner and outer codes; and transmitting the inner and outer code sequences as a concatenated signal.

12. The method of claim 11 wherein generating said (n,k) short binary block code comprises generating a (12,8;3) short binary block code by:

forming a first block code sequence from a subset of the eight data bits of the source signal to be transmitted, including a parity bit based on the subset of data bits;

forming a second block code sequence from the remaining data bits of the eight bits of the source signal, including three parity bits based on the remaining data bits; and generating said short binary block code as a two block sequence of the said first block code sequence, and said first block code sequence combined with said second block code sequence.

13. The method of claim 12 wherein the eight bit source signal comprises a sequence of $a_0$, $a_1$, $a_2$, $a_3$, $a_4$, $a_5$, $a_6$, and $a_7$, and said first block code sequence is formed as $a_3$, $a_4$, $a_5$, $a_6$, $a_7$, $a_3+a_4+a_5+a_6+a_7$.

14. The method of claim 13 wherein said second block code sequence is formed as $a_0$, $a_1$, $a_2$, $a_1+a_2$, $a_0+a_2$, $a_0+a_1$.

15. The method of claim 11 further comprising receiving the transmitted concatenated signal;

decoding the outer code sequence using a Reed-Solomon decoder; and decoding the inner code sequence using a soft decision decoder.

16. The method of claim 15 wherein decoding the inner code sequence comprises:

adding a received inner codeword to each of a plurality of codewords selected from a set of all possible codewords;

comparing the results of each addition; and identifying which possible codeword best corresponds to the received inner codeword.

17. The method claim 11 wherein generating said (n,k) inner code comprises forming a punctured (15,11) Hamming code.

18. The method of claim 17 comprising selectively deleting three columns of a parity check matrix of said punctured Hamming code to generate a (12,8;3) inner code.

19. The system of claim 18 wherein the eight bit source signal comprises a sequence of $a_0$, $a_1$, $a_2$, $a_3$, $a_4$, $a_5$, $a_6$, and $a_7$, and said inner code comprises a sequence of $a_7$, $a_6$, $a_5$, $a_4$, $a_3$, $a_2$, $a_1$, $P_3$, $P_2$, $P_1$, and $P_0$, where:

$P_3 = a_1$ XOR $a_2$ XOR $a_3$ XOR $a_4$ XOR $a_5$ XOR $a_6$ XOR $a_7$;

$P_2 = a_0$ XOR $a_2$ XOR $a_5$ XOR $a_6$ XOR $a_7$;

$P_1 = a_0$ XOR $a_2$ XOR $a_3$ XOR $a_6$ XOR $a_7$; and $P_0 = a_0$ XOR $a_1$ XOR $a_3$ XOR $a_5$ XOR $a_7$.

* * * * *